United States Patent
Ehrman et al.

(10) Patent No.: US 10,903,655 B2
(45) Date of Patent: Jan. 26, 2021

(54) EXTENDED-LIFE ASSET TRACKING AND SENSING POWER SOURCE AND MANAGEMENT SYSTEM

(71) Applicant: I.D. Systems, Inc., Woodcliff Lake, NJ (US)

(72) Inventors: Michael L. Ehrman, Upper Saddle River, NJ (US); James Gripp, Plano, TX (US); Wojciech Grohman, Little Elm, TX (US); Gaurav Sheth, Mahwah, NJ (US)

(73) Assignee: I.D. Systems, Inc., Woodcliff Lake, NJ (US)

( * ) Notice: Subject to any disclaimer, the term of this patent is extended or adjusted under 35 U.S.C. 154(b) by 686 days.

(21) Appl. No.: 15/496,386

(22) Filed: Apr. 25, 2017

(65) Prior Publication Data

US 2018/0090937 A1    Mar. 29, 2018

Related U.S. Application Data

(60) Provisional application No. 62/400,265, filed on Sep. 27, 2016.

(51) Int. Cl.
| | |
|---|---|
| *H02J 3/38* | (2006.01) |
| *H02J 7/35* | (2006.01) |
| *G01R 31/36* | (2020.01) |
| *G01R 31/44* | (2020.01) |
| *H02J 7/34* | (2006.01) |

(52) U.S. Cl.
CPC .......... *H02J 3/382* (2013.01); *G01R 31/3647* (2019.01); *G01R 31/44* (2013.01); *H02J 3/383* (2013.01); *H02J 7/345* (2013.01); *H02J 7/35* (2013.01); *H02J 2300/00* (2020.01); *H02J 2300/20* (2020.01); *H02J 2300/22* (2020.01)

(58) Field of Classification Search
None
See application file for complete search history.

(56) References Cited

U.S. PATENT DOCUMENTS

| | | | |
|---|---|---|---|
| 6,982,544 B2 * | 1/2006 | Tran .................... | G01R 31/3648 320/132 |
| 7,081,693 B2 * | 7/2006 | Hamel ................. | B60C 23/0411 307/151 |
| 8,264,194 B1 * | 9/2012 | Spangler ................. | G06F 1/263 320/101 |
| 9,247,445 B2 * | 1/2016 | Honda .................. | H04W 24/10 |

(Continued)

*Primary Examiner* — Carlos Amaya
(74) *Attorney, Agent, or Firm* — Troutman Pepper Hamilton Sanders LLP; James E. Schutz; Brennan M. Carmody (57) ABSTRACT

A power source and power management system including: a controller configured to transmit tracking information of the power source and power management system; an energy harvesting power source; a non-degrading rechargeable power source electrically connected to the energy harvesting power source and configured to be recharged by energy generated by the energy harvesting power source; and a power manager configured to control switching of a system power source between the energy harvesting power source and the non-degrading rechargeable power source based on a power state of the energy harvesting power source and a power state of the non-degrading rechargeable power source.

20 Claims, 7 Drawing Sheets

(56) References Cited

U.S. PATENT DOCUMENTS

| | | | |
|---|---|---|---|
| 2004/0232878 A1* | 11/2004 | Couch | H02J 1/14 320/101 |
| 2010/0085063 A1* | 4/2010 | Lebrunie | H02J 7/0029 324/537 |
| 2010/0133903 A1* | 6/2010 | Rufer | F02C 6/16 307/22 |
| 2011/0084645 A1* | 4/2011 | Seo | H02J 3/32 320/101 |
| 2012/0201041 A1* | 8/2012 | Gergets | B60Q 1/2611 362/493 |
| 2012/0256492 A1* | 10/2012 | Song | H02J 7/025 307/66 |
| 2013/0278067 A1* | 10/2013 | Poss | B65F 1/0033 307/62 |
| 2014/0088776 A1* | 3/2014 | Brandt | H02J 3/32 700/295 |
| 2014/0210275 A1* | 7/2014 | Gong | H02J 3/383 307/82 |
| 2014/0214223 A1* | 7/2014 | Tsunoda | H02J 3/24 700/292 |
| 2014/0236883 A1* | 8/2014 | Ye | G06N 7/02 706/52 |
| 2015/0213709 A1* | 7/2015 | Miller | H02J 7/35 340/693.2 |
| 2015/0244313 A1* | 8/2015 | McNamara | H02J 3/14 136/244 |
| 2015/0371511 A1* | 12/2015 | Miller | G01S 19/16 340/545.6 |
| 2016/0294190 A1* | 10/2016 | Li | B60L 50/61 |
| 2016/0315493 A1* | 10/2016 | Lambersend | G08C 17/02 |
| 2017/0069144 A1* | 3/2017 | Lawrie-Fussey | G07C 5/085 |
| 2017/0194791 A1* | 7/2017 | Budde | G06F 1/263 |
| 2017/0257024 A1* | 9/2017 | Wu | H02M 3/07 |
| 2017/0279275 A1* | 9/2017 | Yamamoto | H02J 7/35 |
| 2018/0367874 A1* | 12/2018 | Stampfl | B25B 21/00 |

* cited by examiner

EXTENDED-LIFE ASSET TRACKING AND SENSING POWER SOURCE AND MANAGEMENT SYSTEM

CROSS-REFERENCE TO RELATED APPLICATIONS

This application claims priority to and the benefit of U.S. Provisional Application No. 62/400,265, filed Sep. 27, 2016, which is incorporated herein by reference in its entirety.

TECHNICAL FIELD

Aspects of the present disclosure relate to power sources and management systems, and, more particularly, to extended-service life power sources and management systems for asset tracking and sensing.

BACKGROUND

In the related art, asset tracking and sensing systems utilize rechargeable Lithium-Ion (Li-Ion) and Lithium Polymer (Li—Po) batteries as a power source. In the related art, vehicle power sources or renewable sources may be used to recharge the Li-Ion and Li—Po batteries. However, in the related art, the service life of the rechargeable battery is typically limited to about five years based on the number of charge and discharge cycles, the depth of discharge, the amount of time in the discharge state, and physical decomposition of the battery materials. Therefore, what is needed is an extended service-life power source and power management system for use with tracking and sensing systems.

SUMMARY

In some example embodiments, there is provided a power source and power management system including: a controller configured to transmit tracking information of the power source and power management system; an energy harvesting power source; a non-degrading rechargeable power source electrically connected to the energy harvesting power source and configured to be recharged by energy generated by the energy harvesting power source; and a power manager configured to control switching of a system power source between the energy harvesting power source and the non-degrading rechargeable power source based on a power state of the energy harvesting power source and a power state of the non-degrading rechargeable power source.

The power source and power management system may further include a cargo sensor. The controller may be further configured to control activation and deactivation of the cargo sensor and to transmit sensor data collected by the cargo sensor.

The controller may be further configured to adjust a transmission schedule of the tracking information correlated with the power state of the non-degrading rechargeable power source.

The controller is further configured to: track a state of charge of the non-degrading rechargeable power source over time; and determine a state of health of the energy harvesting power source based on the state of charge of the non-degrading rechargeable power source over time.

The controller is further configured to: store data indicating a state of charge of the non-degrading rechargeable power source over time; analyze the stored data indicating the state of charge of the non-degrading rechargeable power source over a period of time; and determine that the energy harvesting power source is in need of repair or replacement in response to the analyzing the stored data indicating that the state of charge of the rechargeable power source only decreases over time.

The energy harvesting power source may include a solar panel having built in redundancy.

The energy harvesting power source may include a plurality of separate solar panels.

The energy harvesting power source may include a kinetic energy harvesting device.

The non-degrading rechargeable power source may include a super-capacitor bank.

The power source and power management system may further include a third power source. The controller may be further configured to, in response to the third power source being empty of charge, transmit the tracking information only when the non-degrading rechargeable power source has sufficient charge to power the power source and power management system or the energy harvesting power source is generating sufficient energy to power the power source and power management system.

The power source and power management system may further include a third power source. The power manager may be configured to control switching of the system power source between the energy harvesting power source, the non-degrading rechargeable power source, and the third power source based on the power state of the energy harvesting power source, the power state of the non-degrading rechargeable power source, and a power state of the third power source.

The power manager may be configured to: switch the system power source to the energy harvesting power source in response to the energy harvesting power source generating sufficient energy to power the power source and power management system, switch the system power source to the non-degrading rechargeable power source in response to the energy harvesting power source not generating sufficient energy to power the power source and power management system and the non-degrading rechargeable power source having sufficient charge to power the power source and power management system, and switch the system power source to the third power source in response to the energy harvesting power source not generating sufficient energy to power the power source and power management system and the non-degrading rechargeable power source having insufficient charge to power the power source and power management system.

The controller may be further configured to: increase, in response to the power state indicating of the non-degrading rechargeable power source that the non-degrading rechargeable power source is in a more fully charged state than a previous charged state, a rate of reporting; decrease, in response to the power state of the non-degrading rechargeable power source indicating that the non-degrading rechargeable power source is in a less charged state than the previous charged state, the rate of reporting; and transmit the tracking information of the power source and power management system according to the rate of reporting.

The power source and power management system may further include a sensor. The controller may be further configured to: increase, in response to the power state of the non-degrading rechargeable power source indicating that the non-degrading rechargeable power source is in a more fully charged state than the previous charged state, a rate of data collection by the sensor; decrease, in response to the power state of the non-degrading rechargeable power source indicating that the non-degrading rechargeable power source is in a less charged state than the previous charged state, the rate of data collection by the sensor; and transmit the tracking information and the data collected by the sensor according to the rate of reporting.

According to some embodiments, there is provided a method of an asset tracking system of reporting tracking information, the method including: detecting first power state information of a rechargeable power source of the asset tracking system; increasing, in response to the first power state information indicating that the rechargeable power source is in a more fully charged state than a previous charged state, a rate of reporting; detecting second power state information of the rechargeable power source; decreasing, in response to the second power state information indicating that the rechargeable power source is in a less charged state than the previous charged state, the rate of reporting; and reporting the tracking information according to the rate of reporting.

The asset tracking system may further include a sensor. The method may further include: increasing, in response to the first power state information indicating that the rechargeable power source is in a more fully charged state than the previous charged state, a rate of data collection by the sensor; decreasing, in response to the second power state information indicating that the rechargeable power source is in a less charged state than the previous charged state, the rate of data collection by the sensor; and reporting the tracking information and the data collected by the sensor according to the rate of reporting.

According to some embodiments, there is provided a method of determining a state of health (SOH) of an energy harvesting device, the method including: detecting a state of charge (SOC) of a rechargeable power source, the rechargeable power source being configured to be charged by energy generated by the energy harvesting device; storing data indicating the SOC of the rechargeable power source; analyzing the stored data indicating the SOC of the rechargeable power source over a period of time; and determining the SOH of the energy harvesting device based on a result of the analyzing.

The determining may include, in response to the analyzing the stored data indicating that the SOC of the rechargeable power source only decreases over time, determining that the energy harvesting is in need of repair or replacement.

The determining may include, in response to the analyzing the stored data indicating that the SOC of the rechargeable power source only decreases over a day, determining that the energy harvesting is in need of repair or replacement.

The determining may include, in response to the analyzing the stored data indicating that the SOC of the rechargeable power source only decreases over a two or more days, determining that the energy harvesting is in need of repair or replacement.

BRIEF DESCRIPTION OF THE FIGURES

The accompanying drawings illustrate one or more embodiments and/or aspects of the disclosure and, together with the written description, serve to explain the principles of the disclosure. Wherever possible, the same reference numbers are used throughout the drawings to refer to the same or like elements of an embodiment, and wherein.

DETAILED DESCRIPTION

The present disclosure can be understood more readily by reference to the following detailed description of one or more example embodiments and the examples included herein. It is to be understood that embodiments are not limited to the example embodiments described within this disclosure. Numerous modifications and variations therein will be apparent to those skilled in the art and remain within the scope of the disclosure. It is also to be understood that the terminology used herein is for describing specific example embodiments only and is not intended to be limiting. Some example embodiments of the disclosed technology will be described more fully hereinafter with reference to the accompanying drawings. The disclosed technology might be embodied in many different forms and should not be construed as limited to the example embodiments set forth herein.

Some embodiments include a system with an energy harvesting power source, a non-degrading rechargeable power source, and a manager. The manager selects between the power sources based on their power states, increasing a lifetime of the power sources.

The disclosed technology includes an extended-life power source and power management system for use with an asset tracking system or an asset sensing system. The tracking and sensing hardware platforms can be used within various applications, such as, as non-limiting examples, dry van trailers, flatbed trailers, domestic intermodal containers, ocean-going containers, and ocean and intermodal container chassis. In various embodiments, the power management system may adjust operational dynamics of the asset tracking system and the asset sensing system. In some embodiments, components of the power source and power management system may be monitored. Throughout this disclosure, certain example embodiments are described in relation to asset tracking systems. However, embodiments of the disclosed technology are not necessarily so limited. In some embodiments, the disclosed technology may be effective in other asset tracking and sensing systems, as well as other systems requiring long-life power sources and power management.

Figure 1:
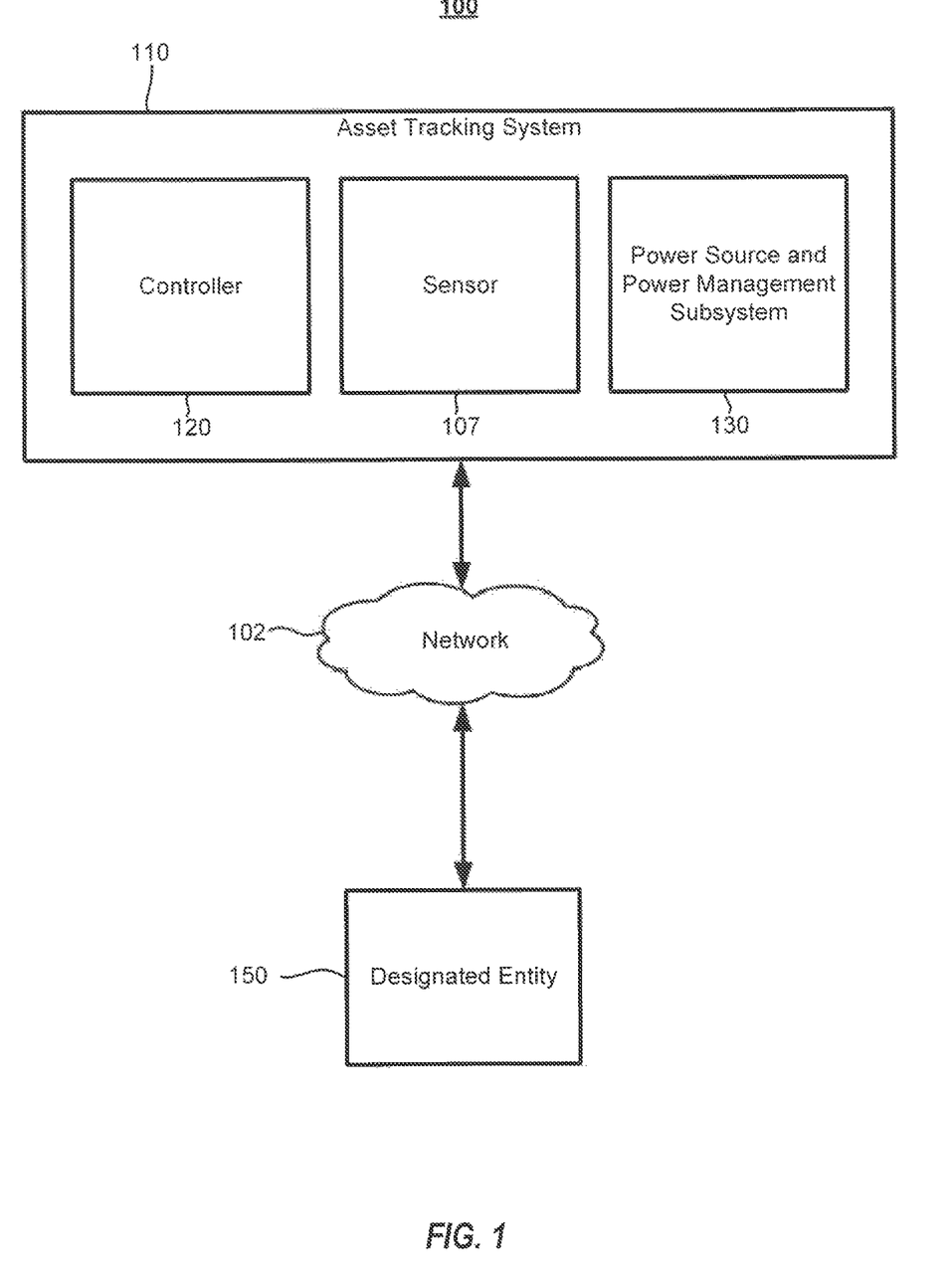
FIG. 1 illustrates an example environment in which implementations of the present disclosure can operate.

FIG. 1 illustrates an example environment 100 in which implementations of the present disclosure can operate. The environment 100 can include an asset tracking system 110, a network 102, and a designated entity 150. The asset tracking system 110 can include a power source and power management subsystem 130 and a controller 120. The designated entity 150 may be a computer system to run services that serves the needs of users or other computers on the network 102. An example computer system is described in greater detail below in conjunction with FIG. 5.

The controller 120 can include a transmitter, a receiver, or a transceiver for interacting with the designated entity 150 via the network 102. The controller 120 is described in further detail below with reference to FIG. 2. The network 102 may be any type of communications medium that allows for the designated entity 150 to communicate with the controller 120. The network 102 may be, for example, a cellular telephone network, a private network (e.g., a local area network (LAN), a wide area network (WAN), intranet, etc.), a corporate network (e.g., a private network for an organization such as a corporation), a satellite communications system, and/or a public network (e.g., the Internet).

In some embodiments, the asset tracking system 110 can include a sensor 107. In some embodiments, the sensor 107 can be, as non-limiting examples, an ultrasonic sensor, a camera/video-based sensor, a laser sensor, or equivalent, or a collection of any combination of such sensors. The sensor 107 can detect information about the assets under the control of the controller 120.

The power source and power management subsystem 130 provides power to one or more elements of the asset tracking system 110. The power source and power management subsystem 130 may provide power state information to the controller 120. A more detailed description of the power source and power management subsystem 130 will be provided below with reference to FIG. 3.

Figure 2:
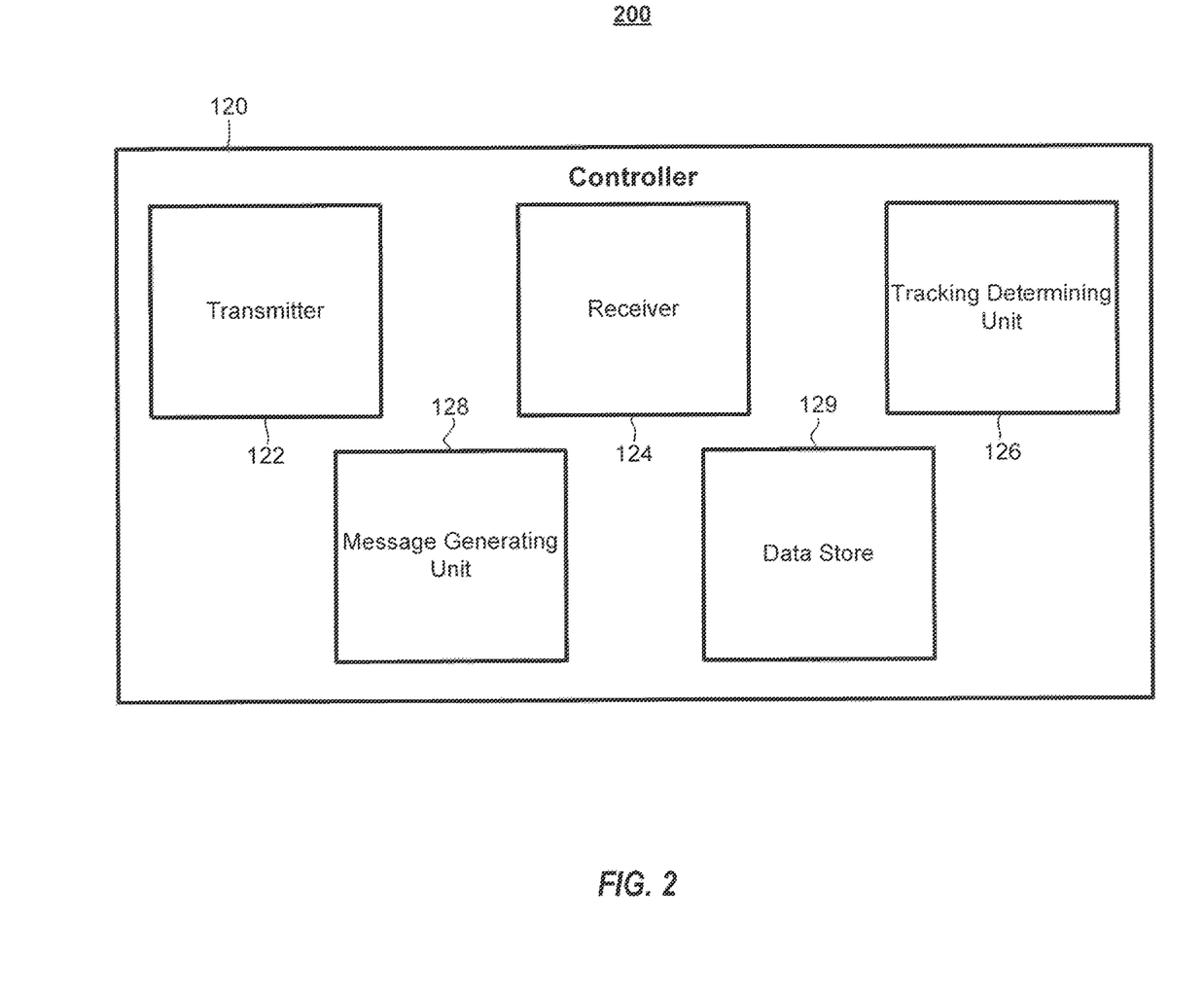
FIG. 2 is a block diagram of an example controller in accordance with the present disclosure.

FIG. 2 is a block diagram 200 of an example controller 120 in accordance with the present disclosure. The controller 120 may include a transmitter 122, a receiver 124, a tracking determining unit 126, a message generating unit 128, and a data store 129. The tracking determining unit 126 and message generating unit 128 may be implemented as software executed by a processor. According to some embodiments, the controller 120 may be implemented as a microcontroller.

The data store 129 may be a main memory (e.g., read-only memory (ROM), flash memory, dynamic random access memory (DRAM) such as synchronous DRAM (SDRAM), etc.), a static memory (e.g., flash memory, static random access memory (SRAM), etc.), and a secondary memory (e.g., a data storage device), which communicate with each other via a bus. The data store 129 may be responsible for storing information, such as scheduling information that can be used by the tracking determining unit 126 and for controlling the transmitter 122 and, optionally, the sensor 107. Other forms of information that can be stored include, but are not limited to, information tying the asset tracking system 110 with a specific designated entity 150. The scheduling information can include a device reporting schedule.

The receiver 124 may be responsible for receiving a message indicating power state information from the power source and power management subsystem 130. The transmitter 122 can transmit the power state information to the tracking determining unit 126. In some embodiments, the receiver 124 and the transmitter 122 may include a plurality of receivers 124 and transmitters 122 separately responsible for communication with different elements. As a non-limiting example, in some embodiments, a first receiver 124 and a first transmitter 122 may be responsible for communication with the designated entity 150, and a second receiver 124 and a second transmitter 124 may be responsible for communication with the power management subsystem 130. The tracking determining unit 126 can analyze the power state information to determine when to transmit tracking information using the transmitter 122. The tracking information may include information on a location of the asset tracking system 100. In some embodiments, the tracking determining unit 126 may analyze the power state information to determine when to activate and deactivate the sensor 107.

In an example embodiment, the device reporting schedule may be dynamic based on the power state information. For example, the tracking determining unit 126 may increase a rate of reporting when the power state information indicates that the power source is more fully charged, and decrease the event reporting schedule when the power state information indicates that the power source is less charged.

The message generating unit 128 can generate messages based on the power state information, tracking information, and, in some embodiments, sensor data generated by the sensor 107.

Figure 3:
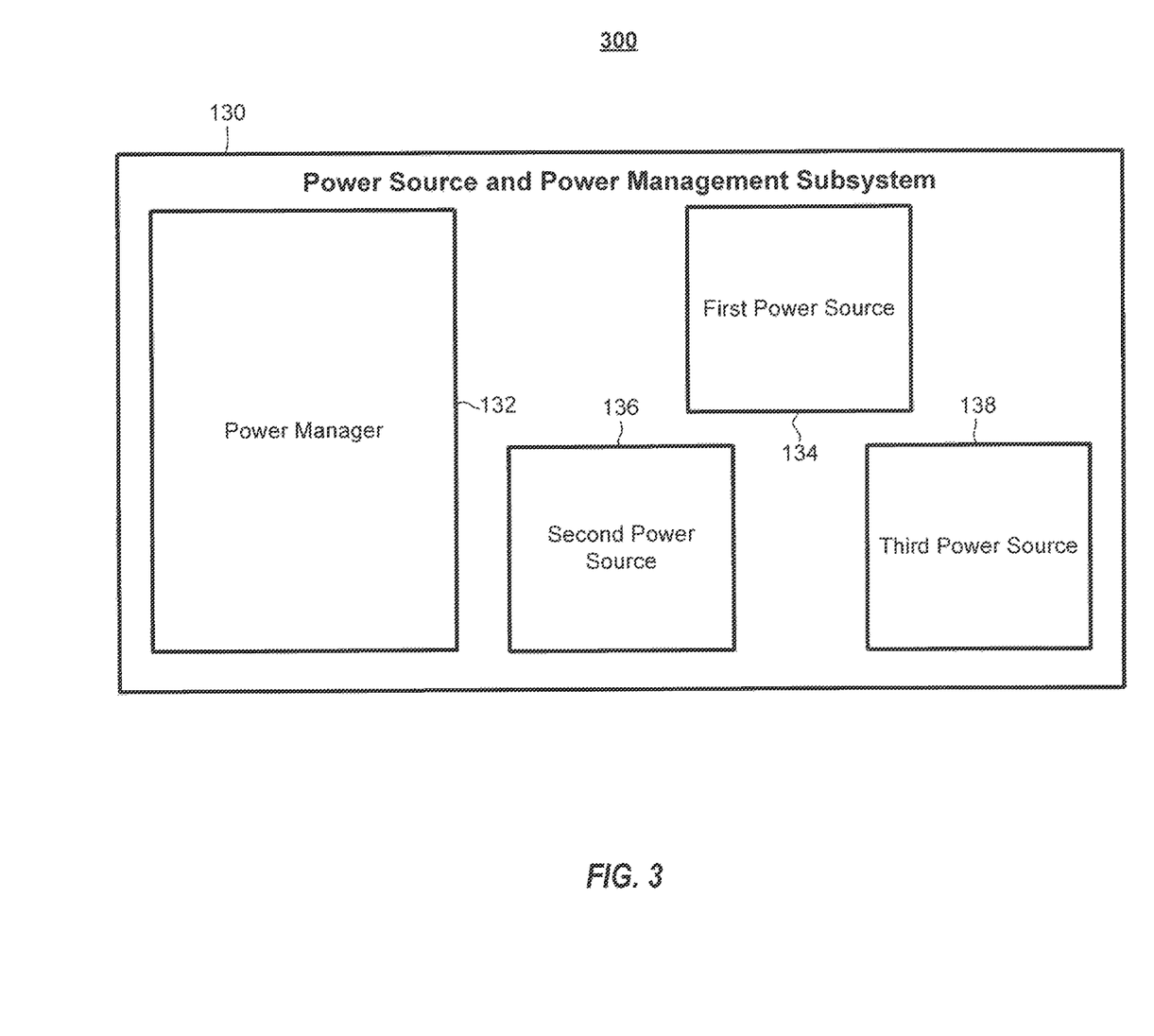
FIG. 3 is a block diagram of an example power source and power management subsystem in accordance with the present disclosure.

FIG. 3 is a block diagram 300 of an example power source and power management subsystem 130 in accordance with the present disclosure. The power source and power management subsystem 130 provides power to one or more elements of the asset tracking system 110. The power source and power management subsystem 130 may include a power manager 132, a first power source 134, a second power source 136, and a third power source 138. In some embodiments, the power source and power management subsystem 130 may not be a distinct and separate subsystem. In some embodiments, the power manager 132 may be integrated into the controller 120. In some embodiments, the power management subsystem 130 may be a standalone device connectable to other devices.

The first power source 134 may be a primary power source for providing power to the asset tracking system 110. The first power source 134 may provide power for recharging the second power source 136. Optionally, the first power source 134 may provide power for recharging the third power source 138. The first power source 134 may be an energy harvesting device, such as a solar panel or a kinetic energy harvesting device. According to some embodiments, the first power source 134 may consist of a plurality of energy harvesting devices.

The second power source 136 may be a substantially non-degrading power source. For example, the second power source 136 may be a plurality of supercapacitors, such as electric double-layer capacitors. The plurality of supercapacitors may be organized as a supercapacitor bank. The second power source 136 may be a technological alternative to supercapacitors having substantially non-degrading recharging capabilities. According to some embodiments, the second power source 136 is substantially non-degraded after ten years of use. In an example embodiment, second power source 136 may include supercapacitors that may degrade their capacity by 30% or less at the end of a 10 year period while operating in an extended temperature range. In some embodiments, the extended temperature range may mean an industrial temperature range of −40° C. to +85° C.

In comparison, a traditional rechargeable battery potentially suffers a 90% capacity degradation within a 5 year period. The rechargeable battery life and capacity may be further reduced by exposure to higher temperatures and/or by a higher frequency of the charge and discharge cycles. For example, some traditional rechargeable batteries suffer reduced capacity at temperatures over 50° C. or 60° C., and may degrade directly proportional to a number of charge and recharge cycles.

The third power source 138 may be a battery. According to some embodiments, the third power source 138 may be a non-rechargeable, long-life battery. According to some embodiments, the third power source 138 may be a rechargeable battery. If the third power source 138 is a rechargeable battery, the third power source 138 may be recharged by power from the first power source 134. According to some embodiments, the third power source 138 may be omitted. According to some embodiments, the third power source 138 may be attachable/detachable from the power source and power management subsystem 130. In some embodiments, the third power source 138 may be field replaceable.

The power manager 132 may switch a system power supply between the first, second, and third power sources 134, 136, and 138. The power manager 132 may preferably supply power from the first power source 134, and then supply power from the second power source 136. The power manager 132 may supply power from the third power source 138 only when power is not available from the first power source 134 and the second power source 136. The power manager 132 may provide power state information to the controller 120. The power state information may include state of charge (SOC) and state of health (SOH) monitoring information. In some embodiments, the power manager 132 may directly provide SOC and SOH monitoring and reporting functionality.

According to some embodiments, the power state information may be used to dynamically adjust a reporting schedule of the asset tracking system 110. For example, the power state information may include SOC information indicating a charge state of the second power source 136. As the charge state of the second power source 136 increases, more aggressive reporting schedules may be implemented providing more frequent reporting. In a state where the second power source 136 has no charge, a least aggressive reporting schedule may be implemented providing a minimal reporting frequency.

According to some embodiments, the power state information may include SOH information indicating a health state of the first through third power sources 134, 136, and 138. In some embodiments, the state of health of the first power source 134 may be derived by analyzing SOC information of the second power source 136 over time. According to some embodiments, either the power manager 132 or the controller 120 may analyze the SOC information of the second power source 136 over time to determine the state of health of the first power source 134. For example, if the SOC information of second power source 136 indicates that a charge of the second power source 136 only decreases over an extended period of time (e.g., days), either the power manager 132 or the controller 120 may determine that the state of health of the first power source 134 is poor (e.g., may be in need of repair or replacement).

According to some embodiments, an external device, such as the designated entity 150 or a server, may analyze the SOH information or the SOC information to determine a state of health of one or more of the first through third power sources 134, 136, and 138. According to some embodiments, the external device may analyze the SOC information of the second power source 136 over time to determine the state of health of the first power source 134. According to some embodiments, the external device may utilize a location or time of use of the asset tracking system in determining a state of health of one or more of the first through third power sources 134, 136, and 138. According to some embodiments, the external device may include an external controller, such as a vehicle control unit present on a vehicle the power source and power management subsystem 130 is installed on.

According to some embodiments, in a case where the third power source 138 is drained or absent, the asset tracking system 110 may be operable based on power from the first power source 134 or the second power source 136. For example, in a case where the third power source 138 is fully drained, the controller 120 may transmit tracking information only when the first power source 134 is generating sufficient power to operate the asset tracking system 110 and/or the second power source 136 has sufficient power to operate the asset tracking system 110.

Figure 4:
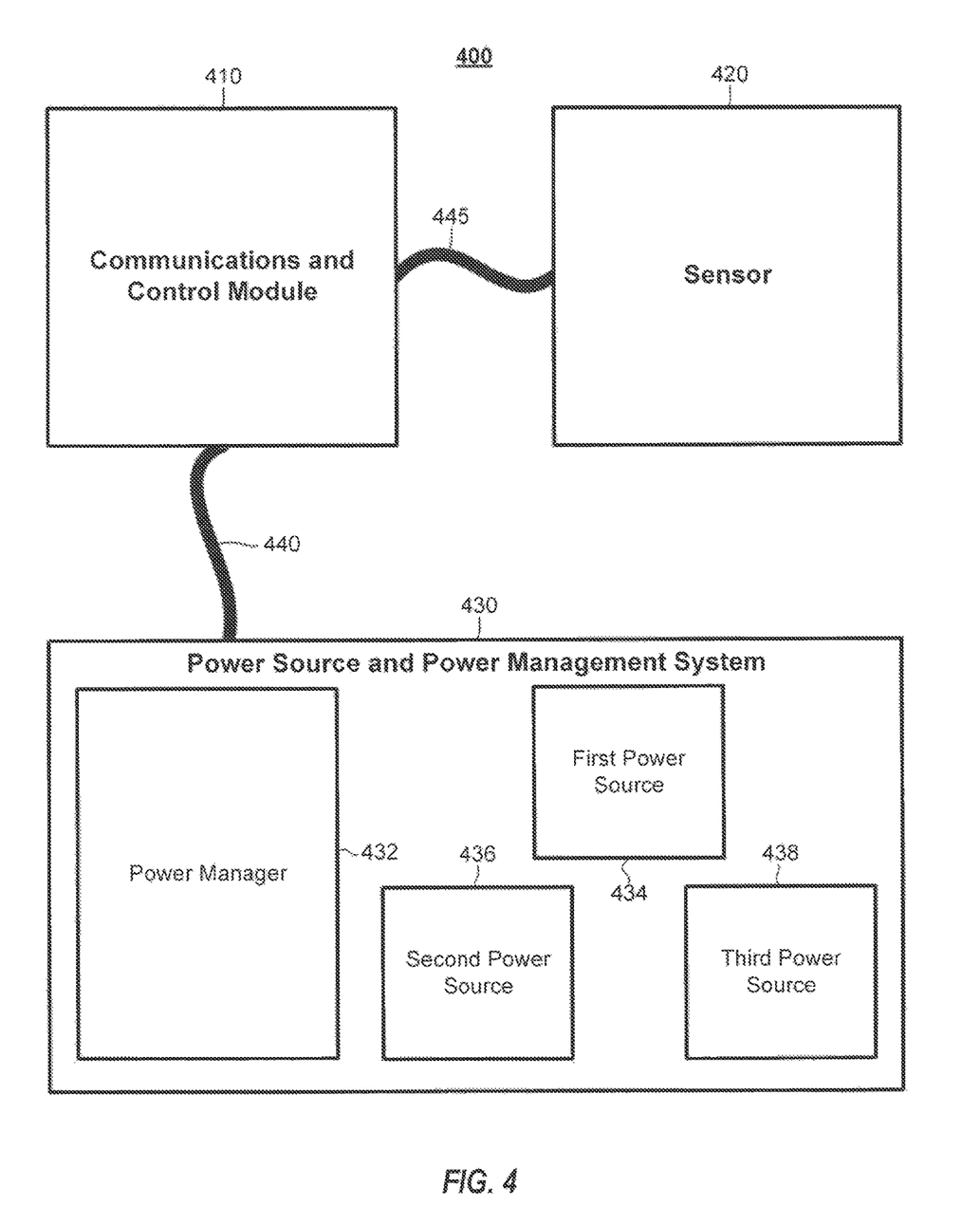
FIG. 4 is a block diagram of a system architecture of an example asset tracking system in which implementations of the present disclosure can operate.

FIG. 4 is a block diagram of a system architecture 400 of an asset tracking system in which implementations of the present disclosure can operate. The system architecture 400 can include a communications and control module 410, a sensor 420, a power source and power management system 430, and bus connectors 440 and 445.

The communications and control module 410 can include various elements for controlling the sensor 420 and for communicating externally, for example, with a designated entity 150. The communications and control module 410 may be similar to the controller 120 described above with reference to FIG. 2.

The sensor 420 detects states of an object under the supervision of the communications and control module 410. In some embodiments, the sensor 420 may be an optional component. In some embodiments, the sensor 420 may be embedded within the communications and control module 410. In some implementations, an object under supervision may be cargo and the sensor 420 may be a cargo or container sensor.

Bus connector 440 connects the communications and control module 410 to the power source and power management system 430. Bus connector 445 connects the communications and control module 410 to the sensor 420. In some embodiments, bus connectors 440 and 445 are configured as a single bus. In some embodiments, bus connectors 440 and 445 are serial communication buses. In some embodiments, bus connectors 440 and 445 may be replaced by alternative means for provided communication between the power source and power management system 430, the communications and control module 410, and the sensor 420.

The power source and power management system 430 may provide power to the communications and control module 410 and the sensor 420. The power source and power management system 430 may include a power manager 432, a first power source 434, a second power source 436, and a third power source 438. In some embodiments, the power source and power management system 430 may be integrated into other elements. In some embodiments, the power manager 432 may be integrated into the communications and control module 410. The elements of the power source and power management system 430 may be substantially similar to the elements of the power source and power management subsystem 130 described above with reference to FIG. 3.

Figure 5:
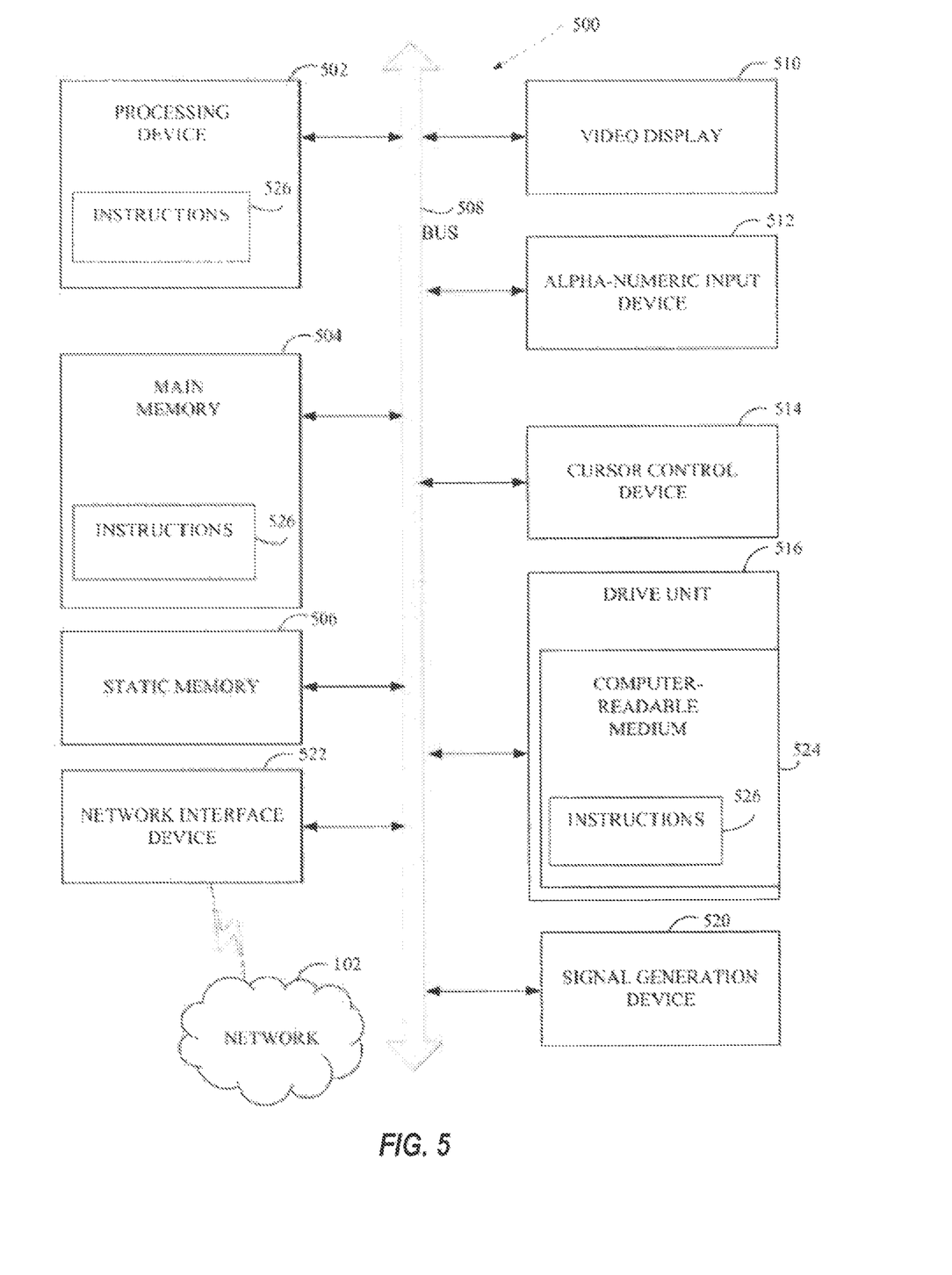
FIG. 5 is a block diagram of an example computer system that may implement certain aspects of the present disclosure.

FIG. 5 is a block diagram of example computer system that may implement certain aspects of the present disclosure. The computer system 500 may include a set of instructions 526 for controlling operation of the computer system 500. In some implementations, the computer system 500 may be connected (e.g., networked) to other machines in a Local Area Network (LAN), an intranet, an extranet, a satellite communications system, or the Internet. The computer system 500 may operate in the capacity of a server or a client machine in a client-server network environment, or as a peer machine in a peer-to-peer (or distributed) network environment. The computer system 500 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while a single computer system 500 is illustrated, the term "machine" shall also be taken to include any collection of machines (e.g., computers) that individually or jointly execute a set (or multiple sets) of instructions to perform any one or more of the methodologies discussed herein.

The computer system 500 includes a processing device 502, a main memory 504 (e.g., read-only memory (ROM), flash memory, dynamic random access memory (DRAM) such as synchronous DRAM (SDRAM), etc.), a static memory 506 (e.g., flash memory, static random access memory (SRAM), etc.), and a secondary memory 516 (e.g., a data storage device), which communicate with each other via a bus 508.

The processing device 502 represents one or more general-purpose processing devices such as a microprocessor, a microcontroller, a central processing unit, or the like. As non-limiting examples, the processing device 502 may be a reduced instruction set computing (RISC) microcontroller, a complex instruction set computing (CISC) microprocessor, a RISC microprocessor, very long instruction word (VLIW) microprocessor, a processor implementing other instruction sets, or one or more processors implementing a combination of instruction sets. The processing device 502 may also be one or more special-purpose processing devices such as an application specific integrated circuit (ASIC), a field programmable gate array (FPGA), a digital signal processor (DSP), network processor, or the like. The processing device 502 is configured to execute the operations for electronically creating and trading derivative products based on one or more indices relating to volatility.

The computer system 500 may further include a network interface device 522. The network interface device may be in communication with a network 102. The computer system 500 also may include a video display unit 510, i.e., a display (e.g., a liquid crystal display (LCD), a touch screen, or a cathode ray tube (CRT)), an alphanumeric input device 512 (e.g., a keyboard), a cursor control device 514 (e.g., a mouse), and a signal generation device 520 (e.g., a speaker).

The secondary memory 516 may include a non-transitory storage medium 524 on which is stored one or more sets of instructions 526 for the computer system 500 representing any one or more of the methodologies or functions described herein. For example, the instructions 526 may include instructions for implementing an asset tracking device including a power source and power management system or subsystem for a container or a trailer. The instructions 526 for the computer system 500 may also reside, completely or at least partially, within the main memory 504 and/or within the processing device 502 during execution thereof by the computer system 500, the main memory 504 and the processing device 502 also constituting computer-readable storage media.

While the storage medium 524 is shown in an example to be a single medium, the term "storage medium" should be taken to include a single medium or multiple media that store the one or more sets of instructions for a processing device. The term "storage medium" shall also be taken to include any medium that is capable of storing or encoding a set of instructions for execution by the machine that cause the machine to perform any one or more of the methodologies of the disclosure. The term "storage medium" shall accordingly be taken to include, but not be limited to, solid-state memories, and optical and magnetic media.

As would be understood by one of ordinary skill, according to some embodiments, one or more elements of the computer system 500 may be included in the controller 120.

Figure 6:
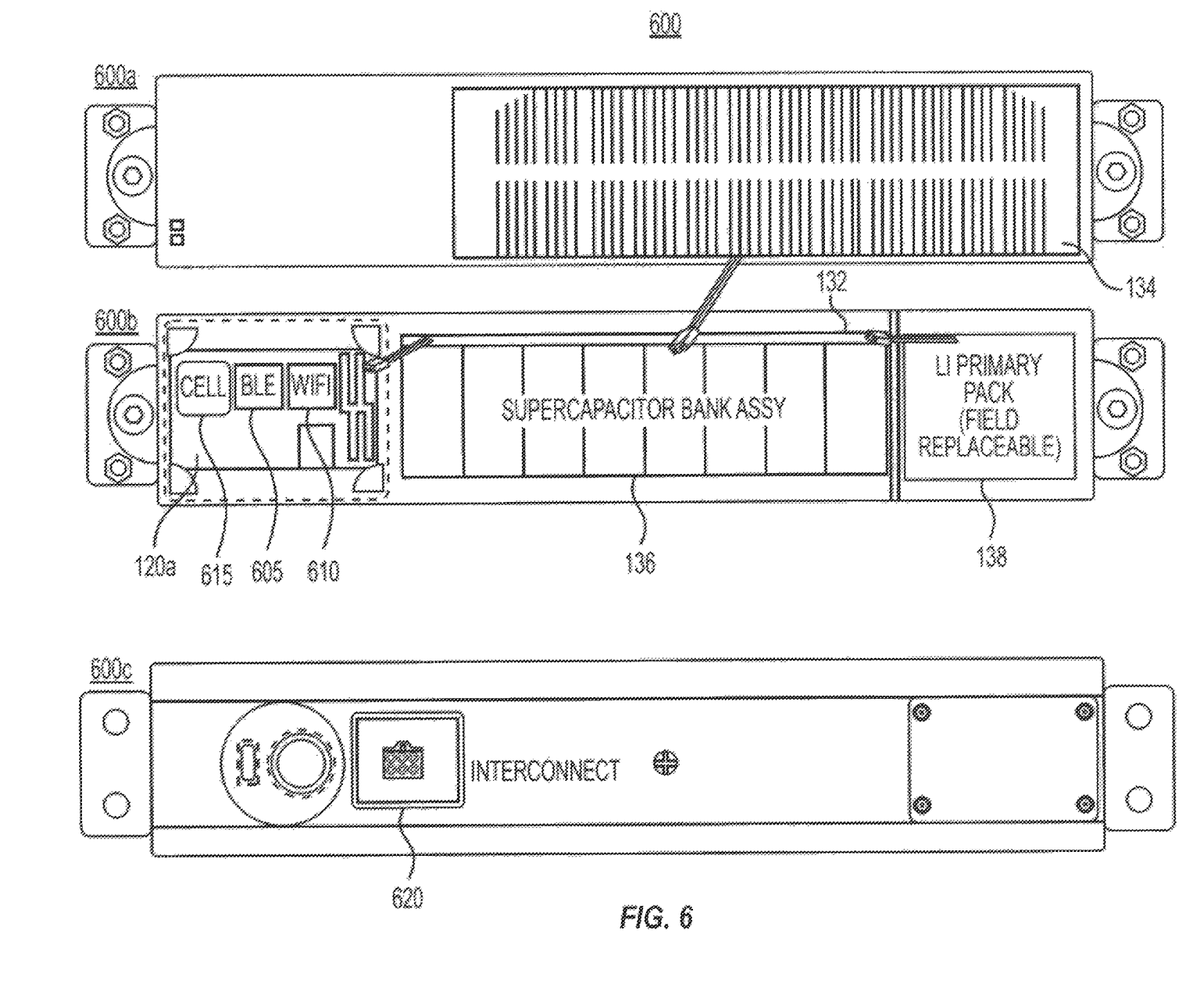
FIG. 6 illustrates planar views of a power source and power management system according to an example embodiment.

FIG. 6 illustrates a power source and power management system 600 according to an example embodiment. A top, planar, external view of the power management system 600 is shown in 600(a). On an external side of the power source and power management system 600, the first power source 134 is disposed. In the embodiment depicted in FIG. 6, the first power source 134 is a solar panel. The first power source 134 is connected to the internal components of the power source and power management system 600.

A planar view of internal components of the power source and power management system is depicted in 600(b). Inside the power source and power management system 600, an embedded controller 120a, a power manager 132, a second power source 136, and a third power source 138 are disposed. In the embodiment depicted in FIG. 6, the second power source 136 is a supercapacitor bank assembly. In the embodiment depicted in FIG. 6, the third power source 138 is a field-replaceable lithium battery pack.

In the embodiment depicted in FIG. 6, the embedded controller 120a includes a Bluetooth low energy (BLE) module 605, a WiFi module 610, and a cellular module 615 (e.g., a cellular modem). The BLE module 605, the WiFi module 610, and the cellular module 615 may be used by the embedded controller 120a and the power manager 132 to send and receive messages. According to one or more example embodiments, one or more of the BLE module 605, the WiFi module 610, or the cellular module 615 may be excluded from the embedded controller 120a. The embedded controller 120a and the power manager 132 may each be implemented as a printed circuit board assembly (PCB or PCBA), such as a TTU PCBA. According to some embodiments, the embedded controller 120a may communicate with the designated entity 150 or an external controller, such as another vehicle control unit present on a vehicle the power management system 600 is installed on. In some embodiments, the embedded controller 120a may be similar to the controller 120 described above with reference to FIG. 2.

In some embodiments, the power manager 132 and/or the embedded controller 120a may control one or more external systems or devices. According to some embodiments, the power manager 132 or the embedded controller 120a may control external devices based on a power state of the first through third power sources 134, 136, and 138. According to some embodiments, the power manager 132 may be integrated with the embedded controller 120a. According to some embodiments, the power manager 132 and the embedded controller 120a may be integrated with an external controller as described above.

A bottom, planar, external view of the power source and power management system is illustrated in 600(c). The power source and power management system 600 may include an interconnect 620 to physically connect the power source and power management system 600 to one or more external devices. According to some embodiments, the interconnect 620 may be a sensor bulkhead interconnect configured to connect the power source and power management system 600 to one or more sensors 107. According to some embodiments, the power source and power management system 600 may only be activated when an external device is connected to the interconnect 620.

Figure 7:
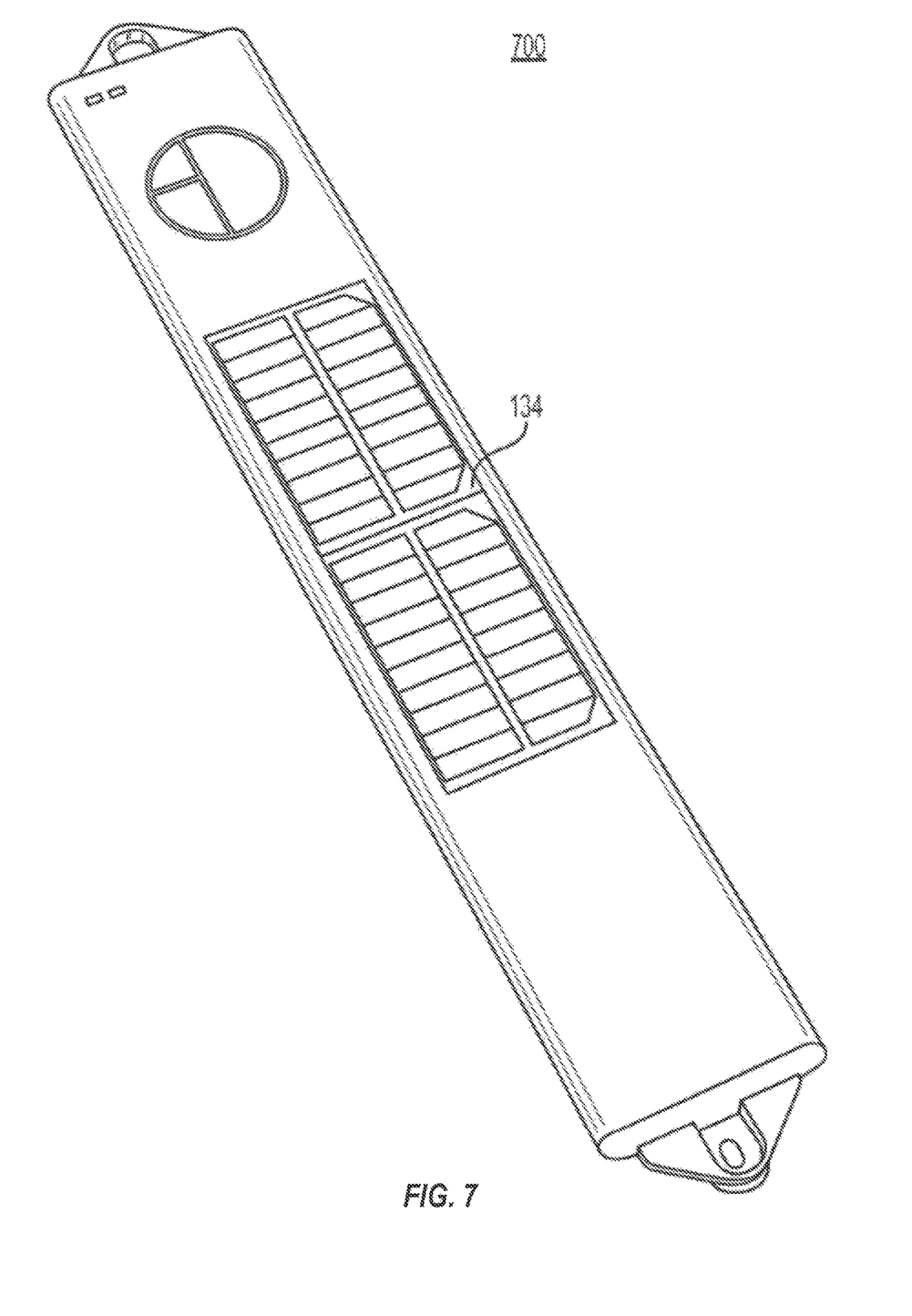
FIG. 7 illustrates a top perspective view of a power source and power management system according to an example embodiment.

FIG. 7 illustrates a top perspective view of a power source and power management system according to an example embodiment. The power source and power management system 700 of FIG. 7 includes the first power source 134. In the embodiment depicted in FIG. 7, the first power source 134 is a solar panel. In some embodiments, the solar panel may include built-in redundancy such that damage to one area of the solar panel will not completely stop operation of the entire solar panel. According to some embodiments, the first power source 134 may comprise a plurality of separate solar panels. According to some embodiments, one solar panel of the plurality of solar panels may be configured to generate sufficient power to enable the asset tracking system 700 to generate and transmit a diagnostic message. According to some embodiments, the first power source 134 may include a kinetic energy harvesting device. Additional components of the power source and power management system 700 may be similar to components of the power source and power management system 600 discussed above with reference to FIG. 6.

While certain example embodiments of the disclosed technology have been described above, it is to be understood that the disclosed technology is not to be limited to the disclosed embodiments, but on the contrary, is intended to cover various modifications and equivalent arrangements included within the scope of the appended claims and their equivalents. Although specific terms are employed herein, they are used in a generic and descriptive sense only and not for purposes of limitation. It is intended that each term contemplates its broadest meaning as understood by those skilled in the art and includes all technical equivalents that operate in a similar manner to accomplish a similar purpose.

In the above description, numerous specific details are set forth. However, it is to be understood that some embodiments of the disclosed technology may be practiced without these specific details. In other instances, well-known methods, structures, and techniques have not been shown in detail in order to avoid obscuring an understanding of this description. References to "one embodiment," "an embodiment," "example embodiment," "some embodiments," "certain embodiments," "various embodiments," etc., indicate that the example embodiment(s) of the disclosed technology so described may include a particular feature, structure, or characteristic, but not that every embodiment necessarily includes the particular feature, structure, or characteristic. Further, repeated use of the phrase "in one embodiment" does not necessarily refer to the same embodiment, although it may.

Unless otherwise noted, the terms used herein are to be understood according to conventional usage by those of ordinary skill in the relevant art. In addition to any provided definitions of terms, it is to be understood that as used in the specification and in the claims, the term "or" is intended to mean an inclusive "or." Further, the terms "a," "an," and "the" are intended to mean one or more unless specified otherwise or clear from the context to be exclusively directed to a singular form.

Unless otherwise specified, the use of the ordinal adjectives "first," "second," "third," etc., to describe a common object, merely indicates that different instances of like objects are being referred to, and are not intended to imply that the objects so described must be in a given sequence, either temporally, spatially, in ranking, or in any other manner.

The materials described herein as making up the various elements of some example embodiments are intended to be illustrative only and not restrictive. Many suitable materials that would perform a same or a similar function as the materials described herein are intended to be embraced within the scope of the present disclosure. Such other materials not described herein can include, but are not limited to, materials that are developed after the time of the development of the invention.

This written description uses examples to disclose certain example embodiments of the disclosed technology, including the best mode, and also to enable any person skilled in the art to practice certain embodiments of the disclosed technology, including making and using any devices or systems and performing any incorporated methods. The scope of certain embodiments of the disclosed technology is defined in the claims and their equivalents, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A power source and power management system comprising:
    a controller configured to transmit tracking information of the power source and power management system;
    an energy harvesting power source;
    a non-degrading rechargeable power source electrically connected to the energy harvesting power source and configured to be recharged by energy generated by the energy harvesting power source;
    a third power source; and
    a power manager configured to:
        control switching of a system power source between the energy harvesting power source, the non-degrading rechargeable power source, and the third power source based on a power state of the energy harvesting power source, a power state of the non-degrading rechargeable power source, and a power state of the third power source by:
            switching the system power source exclusively to the energy harvesting power source in response to the energy harvesting power source generating sufficient energy to power the power source and power management system,
            switching the system power source exclusively to the non-degrading rechargeable power source in response to the energy harvesting power source not generating sufficient energy to power the power source and power management system and the non-degrading rechargeable power source having sufficient charge to power the power source and power management system, and
            switching the system power source to the third power source in response to the energy harvesting power source not generating sufficient energy to power the power source and power management system and the non-degrading rechargeable power source having insufficient charge to power the power source and power management system;
        track a state of charge of the non-degrading rechargeable power source over time; and
        determine a state of health of the energy harvesting power source based on the state of charge of the non-degrading rechargeable power source over time.

2. The power source and power management system of claim 1, further comprising a cargo sensor,
wherein the controller is further configured to control activation and deactivation of the cargo sensor and to transmit sensor data collected by the cargo sensor.

3. The power source and power management system of claim 1, wherein the controller is further configured to adjust a transmission schedule of the tracking information correlated with the power state of the non-degrading rechargeable power source.

4. The power source and power management system of claim 1, wherein the controller is further configured to:
store data indicating a state of charge of the non-degrading rechargeable power source over time;
analyze the stored data indicating the state of charge of the non-degrading rechargeable power source over a period of time; and
determine that the energy harvesting power source is in need of repair or replacement in response to the analyzing the stored data indicating that the state of charge of the non-degrading rechargeable power source only decreases over time.

5. The power source and power management system of claim 1, wherein the energy harvesting power source comprises a solar panel having built in redundancy.

6. The power source and power management system of claim 1, wherein the energy harvesting power source comprises a plurality of separate solar panels.

7. The power source and power management system of claim 1, wherein the energy harvesting power source comprises a kinetic energy harvesting device.

8. The power source and power management system of claim 1, wherein the non-degrading rechargeable power source comprises a super-capacitor bank.

9. The power source and power management system of claim 1,
wherein the controller is further configured to, in response to the third power source being empty of charge, transmit the tracking information only when the non-degrading rechargeable power source has sufficient charge to power the power source and power management system or the energy harvesting power source is generating sufficient energy to power the power source and power management system.

10. The power source and power management system of claim 1, wherein the controller is further configured to:
increase, in response to the power state indicating of the non-degrading rechargeable power source that the non-degrading rechargeable power source is in a more fully charged state than a previous charged state, a rate of reporting;
decrease, in response to the power state of the non-degrading rechargeable power source indicating that the non-degrading rechargeable power source is in a less charged state than the previous charged state, the rate of reporting; and
transmit the tracking information of the power source and power management system according to the rate of reporting.

11. The power source and power management system of claim 10, further comprising a sensor,
wherein the controller is further configured to:
increase, in response to the power state of the non-degrading rechargeable power source indicating that the non-degrading rechargeable power source is in a more fully charged state than the previous charged state, a rate of data collection by the sensor;
decrease, in response to the power state of the non-degrading rechargeable power source indicating that the non-degrading rechargeable power source is in a less charged state than the previous charged state, the rate of data collection by the sensor; and
transmit the tracking information and the data collected by the sensor according to the rate of reporting.

12. A power source and power management method comprising:
determining a power state of a non-degrading rechargeable power source;
determining a power state of an energy harvesting power source;
switching a system power source between the energy harvesting power source, the non-degrading rechargeable power source, and a third power source based on the determined power state of the energy harvesting power source, the determined power state of the non-degrading rechargeable power source, and a power state of the third power source by:
switching the system power source to the energy harvesting power source in response to the energy harvesting power source generating sufficient energy to power the power source and power management system,
switching the system power source to the non-degrading rechargeable power source in response to the energy harvesting power source not generating sufficient energy to power the power source and power management system and the non-degrading rechargeable power source having sufficient charge to power the power source and power management system, and
switching the system power source to the third power source in response to the energy harvesting power source not generating sufficient energy to power the power source and power management system and the non-degrading rechargeable power source having insufficient charge to power the power source and power management system;
tracking a state of charge of the non-degrading rechargeable power source over time; and
determining a state of health of the energy harvesting power source based on the state of charge of the non-degrading rechargeable power source over time.

13. The method of claim 12 further comprising transmitting tracking information of the power source and power management system.

14. The method of claim 13 further comprising:
increasing, in response to the power state indicating of the non-degrading rechargeable power source that the non-degrading rechargeable power source is in a more fully charged state than a previous charged state, a rate of reporting; and
decreasing, in response to the power state of the non-degrading rechargeable power source indicating that the non-degrading rechargeable power source is in a less charged state than the previous charged state, the rate of reporting,
wherein transmitting the tracking information comprises transmitting the tracking information according to the rate of reporting.

15. The method of claim 12 further comprising:
determining the power state of a third power source.

16. The method of claim 12 further comprising:
storing data indicating a state of charge of the non-degrading rechargeable power source over time;

analyzing the stored data indicating the state of charge of the non-degrading rechargeable power source over a period of time; and determining that the energy harvesting power source is in need of repair or replacement in response to the analyzing the stored data indicating that the state of charge of the non-degrading rechargeable power source only decreases over time.

17. The method of claim 13, further comprising:

receiving, by an external device, the tracking information according to a rate of reporting; and determining, by the external device, a state of health of the non-degrading rechargeable power source or the energy harvesting power source based on the tracking information.

18. The system of claim 9, wherein the third power source is a non-rechargeable, long-life battery.

19. A power source and power management system comprising:

an energy harvesting power source;

a non-degrading rechargeable power source electrically connected to the energy harvesting power source and configured to be recharged by energy generated by the energy harvesting power source;

a third power source; and a power manager configured to:

control switching of a system power source between the energy harvesting power source, the non-degrading rechargeable power source, and the third power source based on a power state of the energy harvesting power source, a power state of the non-degrading rechargeable power source, and a power state of the third power source by:

switching the system power source to the energy harvesting power source in response to the energy harvesting power source generating sufficient energy to power the power source and power management system, switching the system power source to the non-degrading rechargeable power source in response to the energy harvesting power source not generating sufficient energy to power the power source and power management system and the non-degrading rechargeable power source having sufficient charge to power the power source and power management system, and switching the system power source to the third power source in response to the energy harvesting power source not generating sufficient energy to power the power source and power management system and the non-degrading rechargeable power source having insufficient charge to power the power source and power management system.

20. The power source and power management system of claim 19 further comprising a controller configured to:

transmit tracking information of the power source and power management system; and adjust a transmission schedule of the tracking information correlated with the power state of the non-degrading rechargeable power source.

* * * * *